US 6,701,490 B1

United States Patent
Talukdar et al.

(10) Patent No.: US 6,701,490 B1
(45) Date of Patent: Mar. 2, 2004

(54) CYCLE AND PHASE ACCURATE HARDWARE-SOFTWARE COVERIFICATION

(75) Inventors: Dipankar Talukdar, Irvine, CA (US); Lisa M. Guerra, Los Altos, CA (US)

(73) Assignee: Mindspeed Technologies, Inc., Newport Beach, CA (US)

( * ) Notice: Subject to any disclaimer, the term of this patent is extended or adjusted under 35 U.S.C. 154(b) by 0 days.

(21) Appl. No.: 09/512,937

(22) Filed: Feb. 25, 2000

(51) Int. Cl.[7] .............................................. G06F 17/50
(52) U.S. Cl. ................................. 716/4; 716/5
(58) Field of Search ............................. 362/24; 716/4, 716/5, 18; 703/16, 19; 710/19

(56) References Cited

U.S. PATENT DOCUMENTS 6,152,612 A * 11/2000 Liao et al. ...................... 716/4
6,398,379 B1 * 6/2002 Imai ............................ 362/24

* cited by examiner

Primary Examiner—Matthew Smith
Assistant Examiner—Paul Dinh
(74) Attorney, Agent, or Firm—Farjami & Farjami LLP

(57) ABSTRACT

Cycle and phase accurate hardware-software coverification is disclosed. According to the present disclosure, "cycle accurate" or "phase-accurate" hardware-software coverification is performed while substantially maintaining a high speed for performing the coverification. System activities are divided into a "pre-compute" and a "post-compute" category. Those activities which fall in the pre-compute category are evaluated to ensure that updates to the state of the system are performed on a clock edge immediately following a change in system inputs affecting the state of the system. The state of the system is then updated on the same clock edge at which the pre-compute operation was performed. Those activities which fall in the post-compute category are then evaluated at the same clock edge on which the state of the system was updated. As a result of the post-compute operation, system outputs are timely generated while taking into account the change in the state of the system. The division of system activities into those requiring pre-compute and those requiring post-compute substantially maintains a relatively high speed of hardware-software coverification.

18 Claims, 6 Drawing Sheets

CYCLE AND PHASE ACCURATE HARDWARE-SOFTWARE COVERIFICATION

BACKGROUND OF THE INVENTION

1. Field of the Invention

The present invention is generally in the field of hardware-software coverification and in particular in the field of cycle and phase accurate hardware-software coverification.

2. Background Art

Prior to the advent of hardware-software coverification methods, verification of hardware-software systems was limited to running the software on a physical prototype of the hardware. The main drawbacks with that approach were that errors caught in the hardware prototype were typically very costly to fix, and often resulted in expensive hardware redesigns and significant delays in time-to-market.

In order to overcome the drawbacks of the traditional approach of performing system verification by running the software on a physical hardware prototype, tools and methods for hardware-software coverification were devised. In order to perform hardware-software coverification, the hardware is typically modeled using a Hardware Description Language ("HDL") such as Verilog®. Using an abstract HDL based hardware model, hardware-software coverification can be performed without the need for a physical hardware prototype. However, with the growing complexity of systems comprising a mix of micro controllers, digital signal processors ("DSPs"), RAMs, ROMs, dedicated logic, and various interconnect components, the coverification of the hardware and software designs has become a critical bottleneck in the system design process.

One problem with a thorough hardware-software coverification is the long time that is required to accurately verify any significant amount of software and hardware. Moving to higher levels of hardware abstraction and ignoring some level of detail has increased the speed of hardware-software coverification. In the late 1980's gate-level simulators typically offered performance of about 2–10 instructions per second ("IPS"). In the early 1990's Register Transfer Level ("RTL") simulators improved performance to around 50 IPS. Even more recent hardware models in an HDL environment permit verification of merely 100 IPS. However, with some systems requiring hundreds of thousands of lines of code and millions of instructions to be run just to verify any significant portion of the system, the average system design simulations take hours or days to run, making it very difficult to quickly locate design errors or to test out design changes.

Increasing speed of hardware-software coverification requires more abstract hardware models. On the other hand, higher levels of hardware abstraction reduces the accuracy of the hardware-software coverification. In order to maintain accuracy of the hardware-software coverification, the hardware portion of the system should be modeled such that changes in input and output signals in the hardware (also referred to as "hardware events" in the present application) are properly and reasonably timely reflected in the model.

For example, it is preferable that a change in an input or output signal in the hardware is detected, analyzed and reflected in the state of the system, and that the required system output is computed, all by the end of the clock cycle or the clock phase in which the change in the signal occurred. However, the present hardware-software coverification models are not able to account for and reflect changes in input and output hardware signals by the end of the clock cycle or clock phase in which a change occurs without significantly decreasing the speed of the hardware-software coverification.

In a paper entitled "Cycle and Phase Accurate DSP Modeling and Integration for HW/SW Co-verification," authored by Lisa Guerra, Joachim Fitzner, Dipankar Talukdar, Chris Schlager, Bassam Tabbara, and Vojin Zivojnovic, and published in the Proceedings of 36th Design Automation Conference on June 21–25, 1999, New Orleans, LA, at pages 964–69, integration of "cycle accurate" and "phase accurate" instruction set architecture ("ISA") models of DSPs with other hardware and software components has been discussed. However, the paper does not disclose a hardware-software coverification model which detects, analyzes and reflects the state of the system, and computes the required system output, all by the end of the clock cycle or the clock phase without a significant decrease in the speed of the hardware-software coverification.

As apparent from the above discussion, there is need in the art for a hardware-software coverification model that is "cycle accurate" or "phase accurate" while substantially maintaining a high speed for performing a hardware-software coverification of the system.

SUMMARY OF THE INVENTION

The present invention is directed to and discloses a unique cycle and phase accurate hardware-software coverification. According to the invention, "cycle accurate" or "phase accurate" hardware-software coverification is performed while substantially maintaining a high speed for performing the coverification.

The invention comprises dividing system activities into a "pre-compute" and a "post-compute" category. Those activities which fall in the pre-compute category are evaluated to ensure that updates to the state of the system are performed on a clock edge immediately following a change in system inputs affecting the state of the system. The state of the system is then updated on the same clock edge at which the pre-compute operation was performed. Those activities which fall in the post-compute category are then evaluated at the same clock edge on which the state of the system was updated. As a result of the post-compute operation, system outputs are timely generated while taking into account the change in the state of the system.

The division of system activities into those requiring pre-compute and those requiring post-compute substantially maintains a relatively high speed of hardware-software coverification. Also, the invention's principles apply to a hardware-software coverification model where system inputs are evaluated and system outputs are generated at every clock rising edge (or at every clock falling edge depending on the convention used), i.e. a "cycle accurate" model, as well as to a coverification model where system inputs are evaluated and system outputs are generated at every clock rising edge and also at every clock falling edge, i.e. a "phase accurate" model.

The invention's method of pre-compute, update, and post-compute, results in a timely evaluation of the status of those system inputs that affect the state of the system, a timely updating of the state of the system, and a timely generation of system outputs which depend on the updated state of the system.

DETAILED DESCRIPTION OF THE INVENTION

The present invention is directed to and discloses a unique cycle and phase accurate hardware-software coverification. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely example embodiments of the invention. To maintain brevity, other embodiments of the invention which use the principles of the present invention are not specifically described in the present application and are not specifically illustrated by the present drawings.

Figure 1:
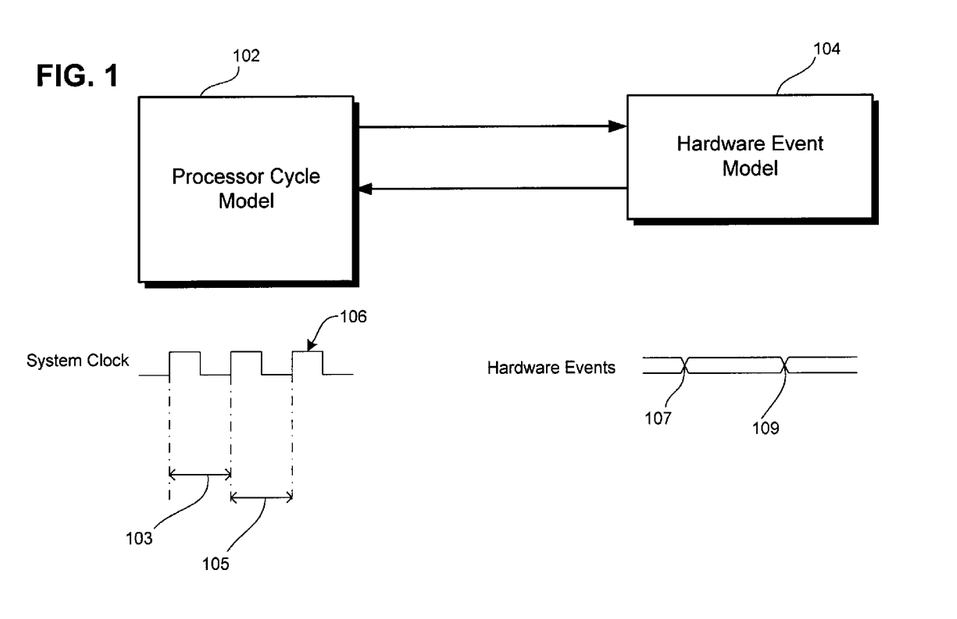
FIG. 1 shows a processor cycle model, a hardware event model, system clock, and hardware events in a hardware-software coverification model.

FIG. 1 shows a "processor cycle model" 102 which is used to test the system software. "Hardware event model" 104 is an abstract model of the system hardware in an HDL environment. Hardware event model 104 is in communication with processor cycle model 102 such that the accuracy of both system software and hardware can be verified. Processor cycle model 102 operates in a "cycle accurate" mode. In other words, the state of the processor and the software running on the processor is updated every clock cycle. System clock 106 includes clock cycles based on which the state of processor cycle model 102 is updated. Individual clock cycles 103 and 105 are example individual clock cycles in system clock 106.

Hardware events 107 and 109 are examples of two hardware events which are generated by hardware event model 104. An example of a hardware event is read data coming back from a memory module external to the processor. Generally, a hardware event can be generated at any time within a clock cycle. Thus, unlike processor cycle model 102 which updates the state of the system software and the processor only on the rising edge of the clock (or the falling edge of the clock depending on the convention used), hardware event model 104 generates hardware events at any time, be it on the edge of the clock cycle, before the edge, or after the edge.

Figure 2:
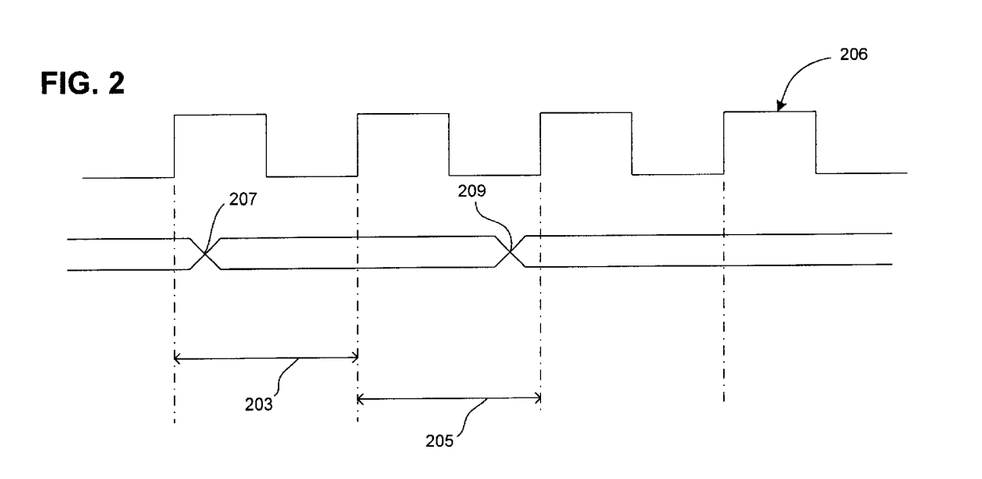
FIG. 2 shows an expanded view of system clock and hardware events in a hardware-software coverification model.

An expanded view of system clock 106 of FIG. 1 is shown as system clock 206 in FIG. 2. Individual clock cycles 203 and 205 are example individual clock cycles in system clock 206. As can be seen from FIG. 2, hardware events 207 and 209 occur, respectively, within clock cycles 203 and 205. Thus, although processor cycle model 102 updates its state only at every rising edge of the clock (or at every falling edge of the clock depending on the convention used), hardware event model 104 generates an event at any time within the clock cycle regardless of whether the event is generated prior to the rising edge of the clock, coincident with the rising edge of the clock, or after the rising edge of the clock. As such, hardware event model 104 is more accurate and has a greater "granularity" than processor cycle model 102. Hardware event model 104 is "event accurate" while processor cycle model 102 is merely "cycle accurate."

Figure 3:
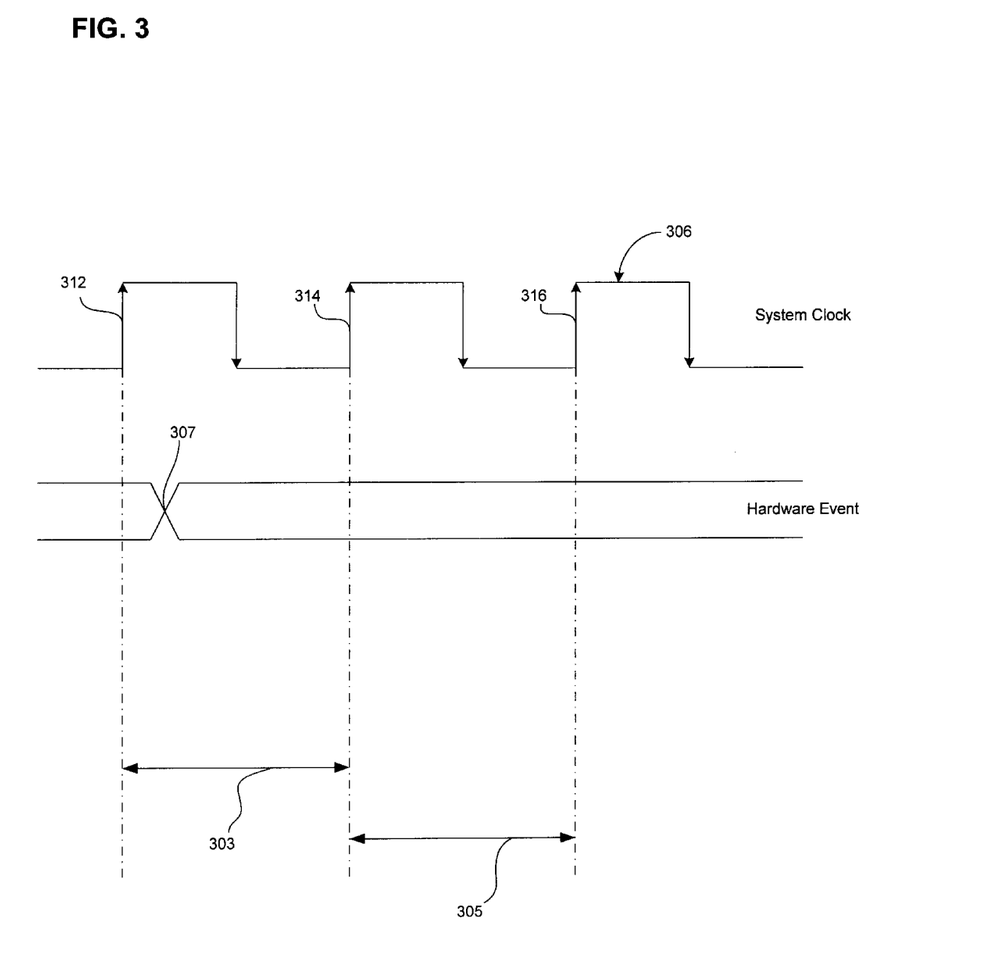
FIG. 3 illustrates the difficulty of an update-compute model in timely updating the state of the system.

FIG. 3 illustrates the difficulty faced in performing hardware-software coverification with an "update-compute" model. FIG. 3 shows example clock rising edges 312, 314, and 316 in system clock 306. As shown in FIG. 3, hardware event 307 occurs between system clock rising edge 312 and system clock rising edge 314. As seen in FIG. 3, hardware event 307 occurs during clock cycle 303 while no hardware event occurs during clock cycle 305. An example of a hardware event is read data coming from an external memory to the processor. Thus, in the example shown in FIG. 3, valid read data is returned from an external memory at time 307.

In an update-compute coverification model, the state of the processor is updated at every clock rising edge (or at every clock falling edge depending on the convention used). The updating of the state is performed by evaluating the system inputs and the system state as of a preceding rising edge of the system clock. By way of example and referring to FIG. 3, a system update is performed at clock rising edge 314 based on an evaluation of the system inputs and the system state as of clock rising edge 312. In other words, in an update-compute coverification model, a hardware event that occurs after clock rising edge 312 does not affect the updating of the state of the system at clock rising edge 314. Thus, hardware event 307 which occurs during clock cycle 303 would not be reflected in the state of the processor as updated on clock rising edge 314. In the present example, data returned from an external memory at time 307 would not affect the state of the system as updated at clock rising edge 314.

In an update-compute model, after a system update at every clock rising edge (or at every clock falling edge), a "compute" is performed. A "compute" operation is one that is performed to generally evaluate the inputs to the system and generate system outputs depending on the state of the system. In the example of FIG. 3, after occurrence of a hardware event at time 307 and an update of the state of the processor at clock rising edge 314, the compute operation is performed at clock rising edge 314 to evaluate the inputs to the system. Thus, although the compute operation occurs at clock rising edge 314, it (i.e. the compute operation) occurs after an update to the processor state has already been performed. Accordingly, the evaluation of the inputs to the system could not be reflected in the state of the system at clock rising edge 314. In fact, any inputs to the system that may affect the state of the system would not have such an effect until the subsequent clock rising edge, i.e. clock rising edge 316. Thus, according to the update-compute model described above, a compute operation performed at clock rising edge 314 does not affect the state of the system until an update operation performed at clock rising edge 316.

Since hardware event 307, for example, data returned an external memory, often does have a bearing on the state of the system, the fact that an update of the system is not performed until clock rising edge 316 is of course a shortcoming of the update-compute model described in relation to FIG. 3. Generally, an update-compute model cannot timely adjust the state of the system in response to hardware events that occur within a clock cycle immediately preceding the clock rising edge at which the update and compute operations are performed.

Figure 4:
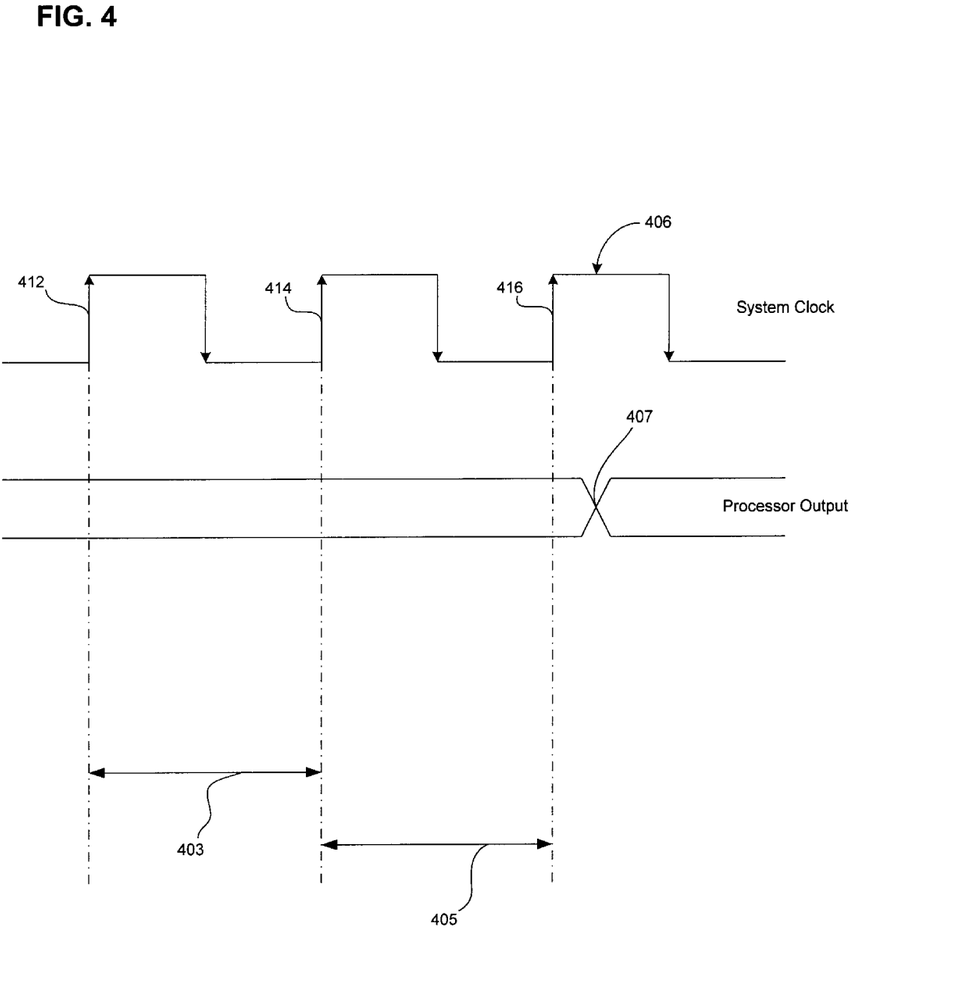
FIG. 4 illustrates the difficulty of a compute-update model in timely generating system outputs.

FIG. 4 illustrates the difficulty faced in performing hardware-software coverification with a "compute-update" model. FIG. 4 shows example clock rising edges 412, 414, and 416 in system clock 406. As shown in FIG. 4, processor output 407 occurs after system clock rising edge 416. As seen in FIG. 4, processor output 407 occurs after clock cycle 405 while no processor output occurs during clock cycles 403 and 405. An example of a processor output is address sent from the processor to an external memory for performing a read or write operation. Thus, in the example shown in FIG. 4, valid address is sent to an external memory at time 407.

In a compute-update coverification model, a "compute" operation is performed at every clock rising edge (or at every clock falling edge depending on the convention used). As stated above, a "compute" operation is performed to generally evaluate the inputs to the system and generate system outputs depending on the state of the system. A compute operation generates system outputs depending on the state of the system as of a preceding clock rising edge. For example, at clock rising edge 414, a compute is performed which generates system outputs depending on the state of the system as of clock rising edge 412. In other words, a compute performed in a "compute-update" model at clock rising edge 414 does not take into account a state change that occurs on clock rising edge 414. Thus, in the above example which is based on a compute-update model, the compute operation occurring at clock rising edge 414 generates system outputs based on the state of the system at clock rising edge 412 and not based on the state of the system at clock rising edge 414.

Suppose that based on various system inputs provided during clock cycle 403, the state of the system is to change so as to require the system to generate a certain address to be sent to an external memory. Such a state change will happen as a result of the update operation performed at clock rising edge 414. However, the state change at clock rising edge 414 occurs after the compute operation already performed at clock rising edge 414. As such, the state change at clock rising edge 414 will not result in the generation of the required memory address until after clock rising edge of 416. The reason is that a compute operation occurring at clock rising edge 414 does not evaluate the update to the system state that occurs at clock rising edge 414. However, a compute operation occurring at clock rising edge 416 does evaluate the update to the system state which occurred at clock rising edge 414. As a result, the required generation of the address to be sent to an external memory does not occur until after clock rising edge 416. In the present example, the external memory would not be addressed until time 407 which is after the compute operation at clock rising edge 416.

The fact that processor output 407, for example, address to be sent to an external memory, does not take place until after clock rising edge 416, is a shortcoming of the compute-update model described in relation to FIG. 4. Generally, a compute-update model cannot timely generate the outputs required by a state change that occurs at the same clock edge on which the compute operation is performed. The outputs required by such a state change are not generated until the subsequent clock rising edge when another compute operation is performed which takes into account the state change.

In order to overcome the shortcomings of the update-compute and compute-update hardware-software coverification models described above, the invention's coverification model properly and timely handles evaluation of system inputs, state changes, and generation of system outputs. Moreover, the invention's coverification model substantially maintains the speed of the update-compute or compute-update coverification models.

Figure 5:
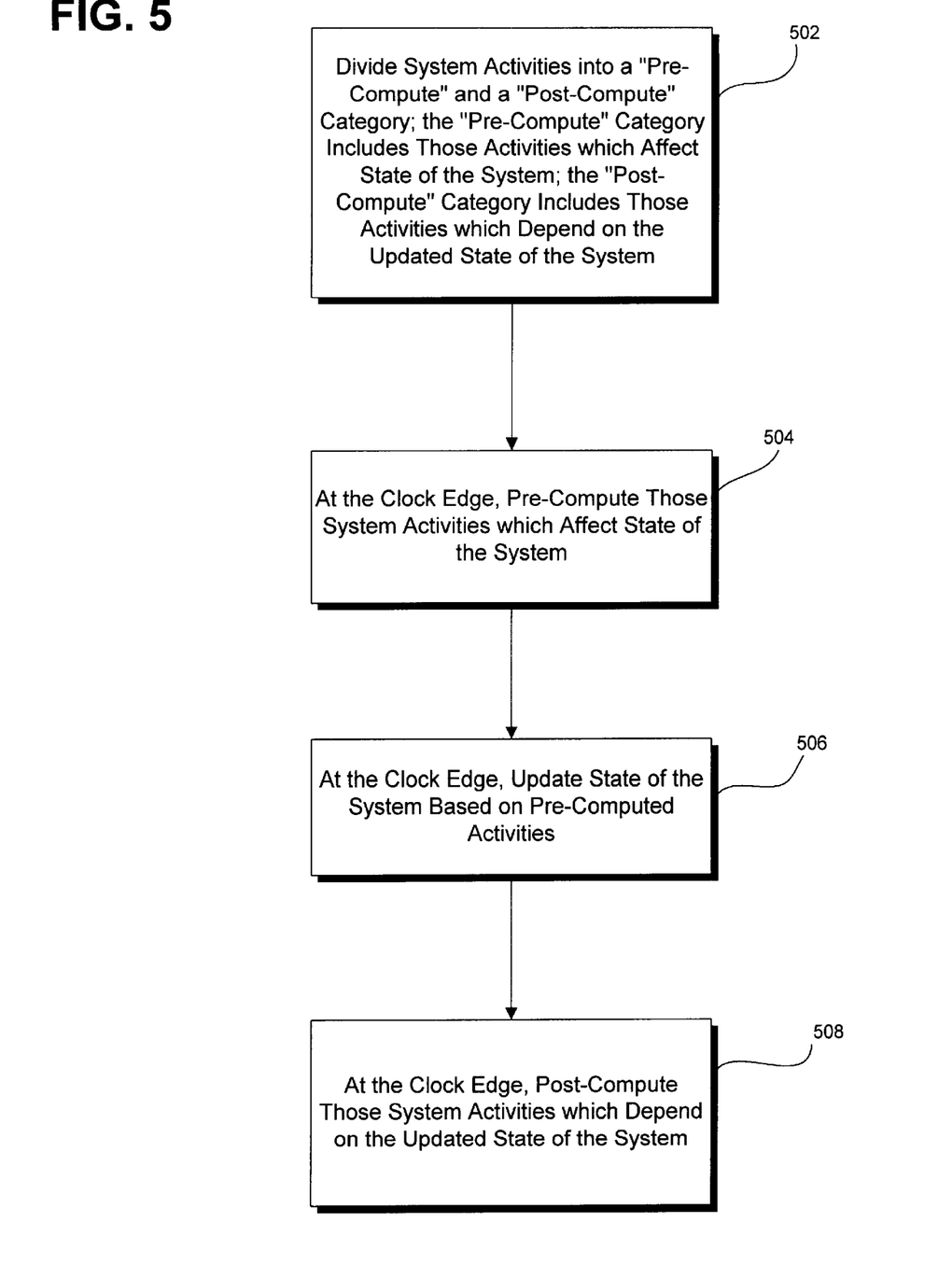
FIG. 5 is a flow chart illustrating the steps performed by the invention's pre-compute, update, and post-compute method.

Referring to the flow chart of FIG. 5, the operation of the invention's hardware-software coverification model is explained. At step 502, it is determined which system activities fall into a category requiring a "pre-compute" and which system activities fall into a category requiring a "post-compute" and a division of system activities into those two categories is performed.

The determination of which system activities fall into the "pre-compute" category is made by analyzing all system activities in order to determine which activities occurring within a clock cycle should be reflected in the state of the system on the very next clock rising edge. Generally, system inputs such as read data returned from an external memory fall within the activities that belong to the pre-compute category. In other words, system inputs such as read data returned from the external memory generally do have an effect on the state of the system and as such the state of the system must change, i.e. be updated, on the very next clock rising edge in response to read data being returned from the external memory.

Thus, reading data returned from an external memory falls into an activity that should be evaluated during a pre-compute operation. Using the present example, in order to perform the pre-compute operation, certain processor inputs must be monitored to determine whether read data has been returned from the external memory. For example, changes at a certain I/O port may have to be monitored in order to determine whether read data has been returned from the external memory. If read data is returned during a particular clock cycle, the pre-compute operation ensures that the state of the system is updated at the very next clock rising edge occurring at the end of that particular clock cycle. Accordingly, an undesirable delay in updating the state of the system is avoided.

Also at step 502, it is determined which system activities fall into a category requiring a "post-compute." The determination of which system activities fall into the "post-compute" category is made by analyzing all system activities in order to determine which activities should occur as a result of a state change in the system and on the same clock rising edge at which the change in the state of the system occurs. Generally, system outputs such as address sent to an external memory fall within the activities that belong to the post-compute category. In other words, system outputs such as address sent to an external memory should generally be generated on the same clock rising edge at which the updated state of the system requires the address to be generated.

Thus, generating and sending an address to an external memory falls into an activity that should be evaluated during a post-compute operation. Using the present example, in order to perform the post-compute operation, the state of the system and certain system inputs must be monitored to determine whether memory address should be generated and sent to the external memory. For example, it must be determined whether the processor is in a state requiring data to be fetched from the external memory for a mathematical operation such as an "ADD" operation. The post-compute operation ensures that the required system outputs are generated on the same clock rising edge as the clock rising edge when the state of the system is updated. Accordingly, an undesirable delay in generating system outputs is avoided.

At step 504, those activities which have been categorized as requiring a "pre-compute," i.e. those activities which should be reflected in the state of the system on the very next clock rising edge, are pre-computed. The pre-computing of such activities results in updating the state of the system (step 506) at the very next clock rising edge following the clock cycle during which those activities occur. At step 508, those activities which have been categorized as requiring a "post-compute," i.e. those activities which should occur on the clock rising edge on which a change in the state of the system occurs, are post-computed. The post-computing of such activities results in the generation of system outputs on the same clock rising edge at which the state of the system is updated.

Figure 6:
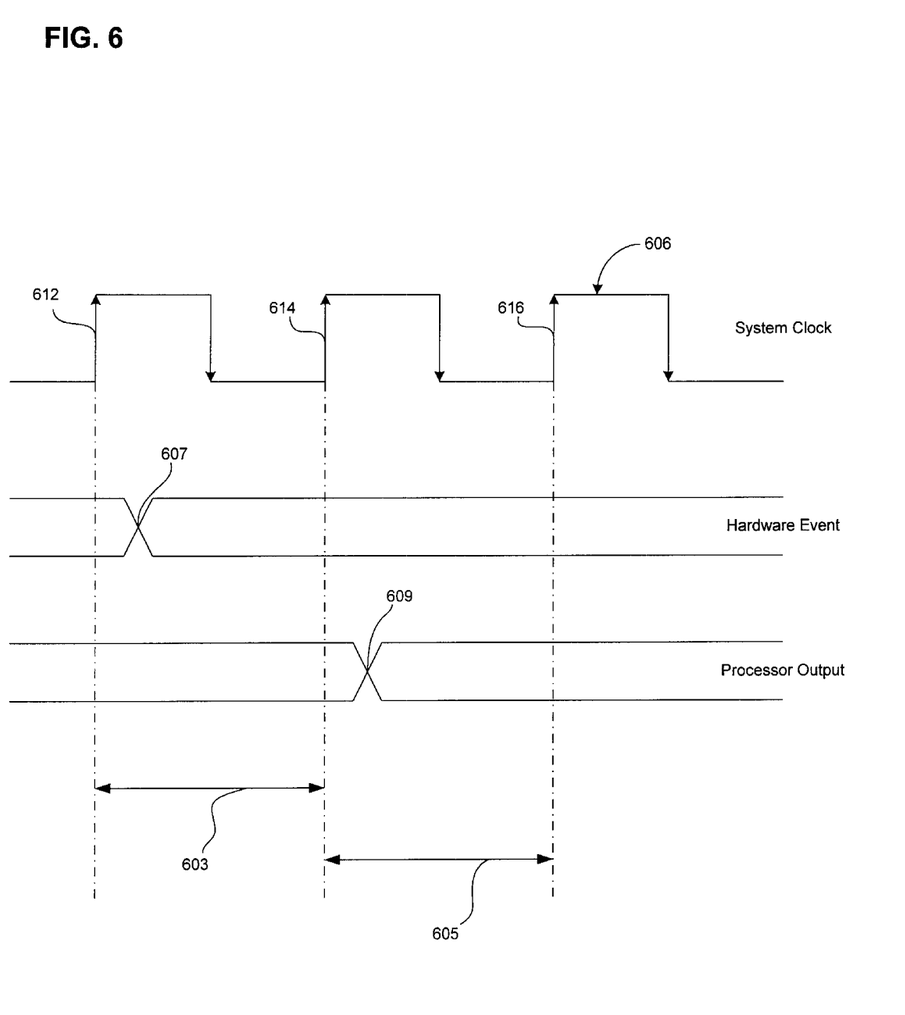
FIG. 6 illustrates that the invention's pre-compute, update, and post-compute method results in timely evaluation of system inputs, timely update of the state of the system, and timely generation of system outputs based on the updated state of the system.

FIG. 6 illustrates that the invention's method of pre-compute, update, and post-compute, results in a timely evaluation of the status of those system inputs that affect the state of the system, a timely updating of the state of the system, and a timely generation of system outputs which depend on the updated state of the system. FIG. 6 shows clock rising edges 612, 614, and 616 in system clock 606. As shown in FIG. 6, hardware event 607 and processor output 609 occur within clock cycles 603 and 605, respectively. An example of hardware event 607 is read data coming from an external memory to the processor and an example of processor output 609 is address sent from the processor to an external memory for performing a read or write operation. Thus, in the example shown in FIG. 6, valid read data is returned from an external memory at time 607 while valid address is sent to an external memory at time 609.

According to the present invention, hardware event 607, i.e. read data coming from an external memory, falls into a pre-compute category. Accordingly, at clock rising edge 614 a pre-compute operation is performed. Following the pre-compute operation, the state of the system is updated on the same clock edge, i.e. on clock rising edge 614. Suppose that the particular data coming from external memory at time 607 places the system in a state which requires addressing the external memory for a read or write operation. According to the invention, a post-compute operation is also performed at clock rising edge 614. The post-compute operation depends on the updated state of the system and results in generating the required memory address and sends the generated memory address from the processor to the external memory at time 609.

From FIG. 6, it is manifest that the invention's pre-compute, update, and post-compute sequence, which occurs at every rising clock edge, results in timely evaluation of the status of those system inputs that affect the state of the system, a timely updating of the state of the system, and a timely generation of system outputs which depend on the updated state of the system.

It is noted that the invention's division of system activities into those requiring pre-compute and those requiring post-compute results in substantially maintaining a relatively high speed of hardware-software coverification. The reason is that if both pre-compute and post-compute operations were to be done without discretion on all system activities, the hardware-software coverification model would operate at a lower speed since the number of computations in the model would increase significantly. However, by dividing the system activities into those requiring pre-compute and those requiring post-compute, the invention's hardware-software coverification model maintains a relatively high speed while being truly "cycle accurate." In other words, the invention's model properly reflects the state of the system as of every clock rising edge (or as of every clock falling edge depending on the convention used) while maintaining a relatively high speed of hardware-software coverification.

It is noted that the above examples regarding the update-compute model, the compute-update model, and the invention's pre-compute, update, post-compute model were given based on "cycle accuracy" as opposed to "phase accuracy." In a "cycle-accurate" model, the system inputs are evaluated and the system outputs are generated at every clock rising edge (or at every clock falling edge depending on the convention used). Thus, "cycle" refers to the fact that one clock cycle elapses between two consecutive clock rising edges (or between two consecutive clock falling edges). However, the same principles apply in a hardware-software coverification model where the system inputs are evaluated and the system outputs are generated at every clock rising edge and also at every clock falling edge. In that case, the coverification model is "phase accurate." Thus, the shortcomings of the update-compute model and the compute-update model discussed above, and the solution provided by the pre-compute, update, post-compute model described above are all applicable to a "phase accurate" model as they were to a "cycle accurate" model which was used in the above examples for the purpose of illustration.

Moreover, while the above examples of the cycle accurate update-compute model, compute-update model, and the invention's pre-compute, update, post-compute model were given by referring to every clock rising edge, it is manifest that the clock cycles could be defined by every clock falling edge instead of every clock rising edge.

The invention's pre-compute, update, post-compute model described above can be implemented and run utilizing various types of computers and programming languages. However, for the purpose of an example, the invention's pre-compute, update, post-compute model can be written in VHDL (VHSIC Hardware Description Language) and C or in VHDL and C++ programming languages. A typical programming tool supporting the writing and running of the invention's pre-compute, update, post-compute model is ModelSiM EE™ made by Model Technology, Inc.™ or by Mentor Graphics, Inc.™ The ModelSiM EE™ programming tool is an HDL simulator which provides the ability to model a system in C++ and VHDL.

An appropriate programming tool, such as ModelSiM EE™, can be used to program a typical computer to run the invention's pre-compute, update, post-compute model to coverify a given hardware-software system. For the purpose of an example, a typical computer which can be programmed to run the invention's pre-compute, update, post-compute model is shown in FIG. 7.

Figure 7:
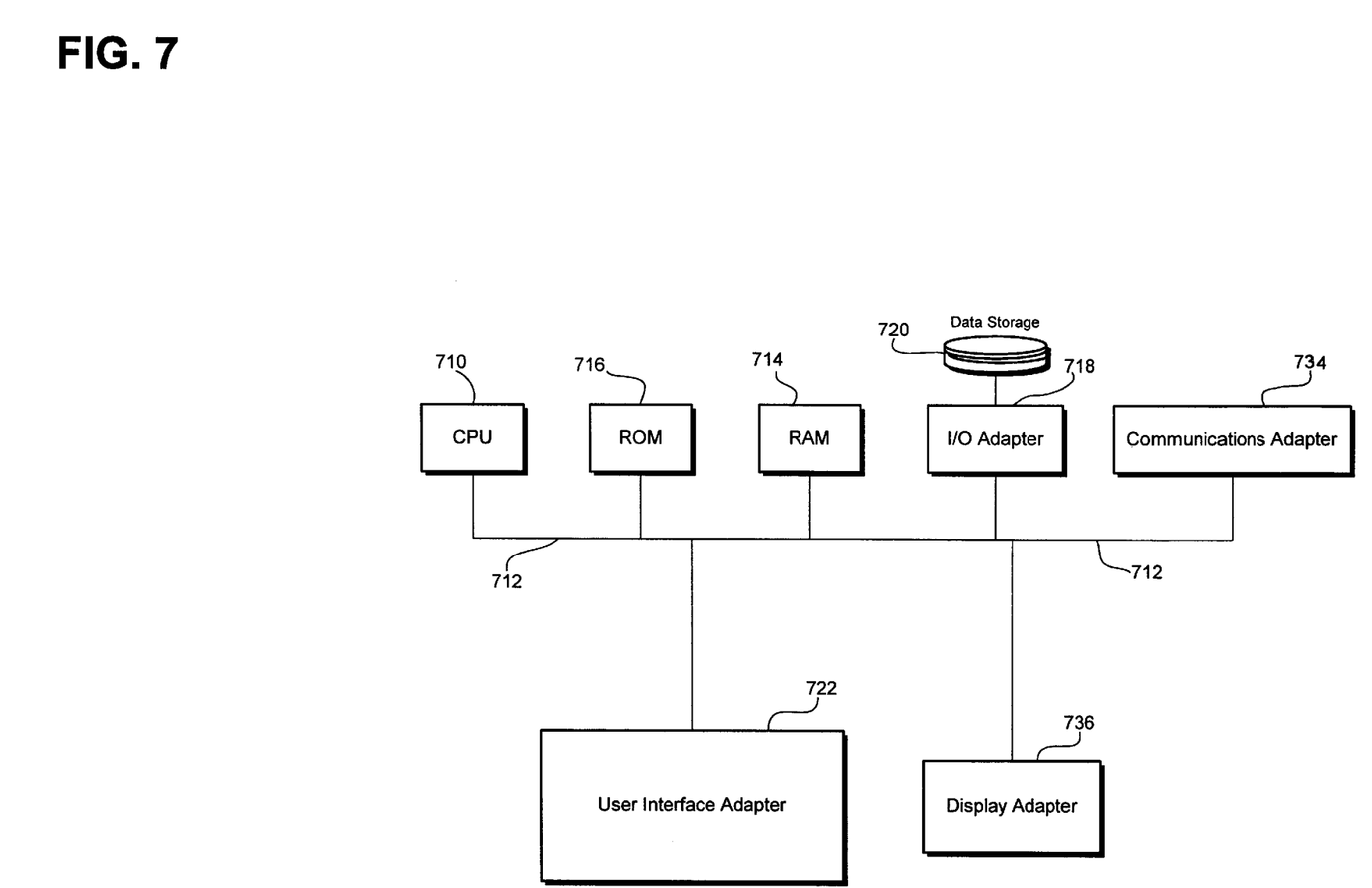
FIG. 7 is a block diagram of a typical computer which can be programmed to run the invention's pre-compute, update, post-compute model.

The example computer shown in FIG. 7 comprises a Central Processing Unit (CPU) 710, a Read Only Memory (ROM) 716, a Random Access Memory (RAM) 714, an Input/Output (I/O) Adapter 718, a disk storage (also called a hard drive) 720, a communications adapter 734, a user interface adapter 722, and a display adapter 736. Bus 712 couples CPU 710, ROM 716, RAM 714, I/O Adapter 718, communications adapter 734, user interface adapter 722, and display adapter 736 as shown in FIG. 7. User interface adapter 722 is typically coupled to an input device such as a keyboard (not shown in FIG. 7) to permit a user to communicate with and control the computer. Display adapter 736 is typically coupled to a monitor (not shown in FIG. 7) for the purpose of communicating and interacting with the user.

By way of an example, the computer shown in FIG. 7 may be an HP® 9000 work station which uses a 32-bit RISC type CPU as CPU 710. However, it is understood and appreciated by those skilled in the art that the invention's pre-compute, update, post-compute model may also be implemented using a variety of different types of computers other than those specifically mentioned herein.

From the above description of the invention it is manifest that various techniques can be used for implementing the concepts of the present invention without departing from its scope. Moreover, while the invention has been described with specific reference to certain embodiments, a person of ordinary skills in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

Thus, a unique cycle and phase accurate hardware-software coverification has been described.

what is claimed is:

1. A method for hardware-software coverification of a system, said method comprising the steps of:
   dividing activities of said system into a pre-compute category comprising a first plurality of activities and a post-compute category comprising a second plurality of activities;
   pre-computing at a clock edge said first plurality of activities;
   updating at said clock edge a state of said system;
   post-computing at said clock edge said second plurality of activities.

2. The method of claim 1 wherein said first plurality of activities comprise hardware events occurring at a plurality of inputs of a processor.

3. The method of claim 2 wherein said hardware events comprise read data returned from an external memory.

4. The method of claim 1 wherein said second plurality of activities comprise processor outputs.

5. The method of claim 4 wherein said processor outputs comprise address sent to an external memory.

6. The method of claim 1 wherein said clock edge is a clock rising edge.

7. The method of claim 1 wherein said clock edge is a clock falling edge.

8. A method for hardware-software coverification of a system, said method comprising the steps of:
   dividing activities of said system into first and second pluralities of activities;
   said first plurality of activities affecting a state of said system;
   said second plurality of activities being affected by said state of said system;
   pre-computing said first plurality of activities at an edge of a clock in said system, updating said state of said system at said edge of said clock in said system, and post-computing said second plurality of activities at said edge of said clock in said system.

9. The method of claim 8 wherein said first plurality of activities comprise hardware events occurring at a plurality of inputs of a processor.

10. The method of claim 9 wherein said hardware events comprise read data returned from an external memory.

11. The method of claim 8 wherein said second plurality of activities comprise processor outputs.

12. The method of claim 11 wherein said processor outputs comprise address sent to an external memory.

13. The method of claim 8 wherein said edge of said clock is a rising edge.

14. The method of claim 8 wherein said edge of said clock is a falling edge.

15. A computer programmed to implement a method for hardware-software coverification of a system, said computer comprising a CPU, a RAM, and a user interface adapter, said method comprising the steps of:
   said computer dividing activities of said system into a pre-compute category comprising a first plurality of activities and a post-compute category comprising a second plurality of activities;
   said computer pre-computing said first plurality of activities at a clock edge of said system;
   said computer updating a state of said system at said clock edge of said system;
   said computer post-computing said second plurality of activities at said clock edge of said system.

16. The computer of claim 15 wherein said computer is programmed in VHDL and C programming languages to implement said method.

17. The computer of claim 15 wherein said computer is programmed in VHDL and C++ programming languages to implement said method.

18. The computer of claim 15 wherein said CPU in said computer is a 32-bit RISC CPU.

* * * * *